US012658900B2

(12) United States Patent
Lau et al.

(10) Patent No.: US 12,658,900 B2
(45) Date of Patent: Jun. 16, 2026

(54) LOW POWER MULTIPLE-FREQUENCY RECEIVER

(71) Applicant: Samsung Electronics Co., Ltd., Gyeonggi-do (KR)

(72) Inventors: Chung Y. Lau, Sunnyvale, CA (US); Sai Krishna Rayudu, Austin, TX (US)

(73) Assignee: Samsung Electronics Co. Ltd (KR)

( * ) Notice: Subject to any disclaimer, the term of this patent is extended or adjusted under 35 U.S.C. 154(b) by 147 days.

(21) Appl. No.: 18/422,433

(22) Filed: Jan. 25, 2024

(65) Prior Publication Data

US 2025/0080122 A1      Mar. 6, 2025

Related U.S. Application Data

(60) Provisional application No. 63/535,790, filed on Aug. 31, 2023.

(51) Int. Cl.
| | |
|---|---|
| *H03D 3/24* | (2006.01) |
| *H03K 5/00* | (2006.01) |
| *H03K 5/14* | (2014.01) |
| *H03L 7/089* | (2006.01) |
| *H03L 7/099* | (2006.01) |

(52) U.S. Cl.
CPC ........... *H03K 5/14* (2013.01); *H03K 5/00006* (2013.01); *H03L 7/089* (2013.01); *H03L 7/099* (2013.01); *H03K 2005/00286* (2013.01)

(58) Field of Classification Search
CPC ................ H03K 5/14; H03K 5/00006; H03K 2005/00286; H03L 7/089; H03L 7/099; H04B 1/408; G01S 19/34; H04J 3/02

USPC ................................. 375/327, 316, 373, 376
See application file for complete search history.

(56) References Cited

U.S. PATENT DOCUMENTS

| | | | |
|---|---|---|---|
| 9,509,351 B2 | 11/2016 | Shaw et al. | |
| 11,303,741 B2 | 4/2022 | Jung et al. | |
| 2006/0022873 A1 | 2/2006 | Zimmerman | |
| 2013/0176171 A1 | 7/2013 | Webber et al. | |
| 2013/0176913 A1* | 7/2013 | Niskanen .................. | H04J 3/02 |
| | | | 370/278 |
| 2013/0229954 A1* | 9/2013 | Narathong ............. | H04B 1/408 |
| | | | 370/280 |

(Continued)

FOREIGN PATENT DOCUMENTS

| | | |
|---|---|---|
| CN | 112105960 | 12/2020 |
| EP | 2427968 | 11/2010 |

(Continued)

OTHER PUBLICATIONS

Korean Office Action dated Aug. 21, 2025 issued in counterpart application No. 10-2024-0083326, 5 pages.

*Primary Examiner* — Phuong Phu
(74) *Attorney, Agent, or Firm* — The Farrell Law Firm, P.C.

(57) ABSTRACT

A multiple-frequency receiver is disclosed and includes a single voltage-controlled oscillator (VCO) configured to generate an output frequency; a first division circuit configured to divide the output frequency by a first value to generate a first local oscillator (LO) frequency for a first frequency chain; and a second division circuit configured to divide the output frequency by a second value to generate a second LO frequency for a second frequency chain, wherein the first value is different than the second value.

20 Claims, 4 Drawing Sheets

(56)        References Cited

U.S. PATENT DOCUMENTS

2023/0266475 A1      8/2023  Yu et al.
2024/0402357 A1 *   12/2024  Pon ......................... G01S 19/34

FOREIGN PATENT DOCUMENTS

EP          2929638        1/2017
KR          10-1224087     1/2013

* cited by examiner

LOW POWER MULTIPLE-FREQUENCY RECEIVER

CROSS-REFERENCE TO RELATED APPLICATION

This application claims the priority benefit under 35 U.S.C. § 119(e) of U.S. Provisional Application No. 63,535, 790, filed on Aug. 31, 2023, the disclosure of which is incorporated by reference in its entirety as if fully set forth herein.

TECHNICAL FIELD

The disclosure generally relates to signal receivers. More particularly, the subject matter disclosed herein relates to reducing power consumption and chip area of global navigation satellite system (GNSS) signal receivers.

SUMMARY

GNSS receivers are used in numerous applications, from personal navigation to high-end scientific research. The efficiency of these receivers for mobile applications is typically gauged by two pivotal performance metrics: power consumption and chip area. As the demand for GNSS receivers grows, especially with the advent of dual-frequency receivers, the need for improvement in these areas becomes paramount. Dual-frequency GNSS receivers, such as the L1/L5 (Note, "L1" and "L5" both refer to specific radio frequency (RF) ranges in the L-band, which will be described later) variety, are renowned for offering increased accuracy by processing signals from two distinct frequency bands. The L1 band is a primary frequency used by many GNSS systems and may include Galileo, global navigation satellite system (GLONASS), global positioning system (GPS) signals for obtaining position information, and Bei-Dou navigation systems. The L5 band is a relatively newer frequency band that may be transmitted at a higher power with a more advanced signal structure, as compared to L1, making L5 signals more robust against interference and multipath errors. The L5 band may include Galileo, GLO-NASS, GPS, Navigation with Indian Constellation (NAVIC), and BeiDou positioning signals, among others. However, as the sophistication of these GNSS devices increases, so does the challenge of managing their power usage and spatial footprint on the chip.

GNSS devices may encounter challenges in efficiently generating local oscillator (LO) signals, which are used for the down-conversion processes within the GNSS receivers. Traditional methods often result in designs that consume significant power or occupy an unnecessarily large chip area, due to the addition of a separate phase-locked loop (PLL) that includes a voltage controlled oscillator. Notably, the generation of accurate in-phase and quadrature (I/Q) signals from counters, especially those with odd divisors like divided-by-3 signals, may pose challenges.

The present application addresses these challenges by configuring a voltage-controlled oscillator (VCO) at a specific and strategic frequency, to achieve multiple advantages. For instance, the VCO's divided-by-4 signal can be harnessed to generate the I/Q LO signals essential for the down-conversion in the L5 frequency chain. This not only simplifies the LO generation but also brings about potential power savings. In addition, the divided-by-3 output from the VCO may be used to generate the LO signal necessary for the L1 frequency chain. Accordingly, a method is proposed to generate multiple LO frequencies necessary for deriving accurate I/Q signals from, for example, a divide-by-3 counter from a single PLL.

Furthermore, the versatility of the proposed solution extends beyond just dual-frequency GNSS receivers. Its novel approach can be applied to generate signals with precise phase differences from any frequency counter that boasts various duty cycle outputs (e.g., 50% duty cycle outputs), making it a potentially transformative solution for a wide array of applications.

According to an aspect of the disclosure, a multiple-frequency receiver includes a single VCO configured to generate an output frequency; a first division circuit configured to divide the output frequency by a first value to generate a first LO frequency for a first frequency chain; and a second division circuit configured to divide the output frequency by a second value to generate a second LO frequency for a second frequency chain, wherein the first value is different than the second value.

According to another aspect of the disclosure, a method includes an output frequency using a single VCO; dividing the output frequency by a first value to generate a first LO frequency for a first frequency chain; and dividing the output frequency by a second value to generate a second LO frequency for a second frequency chain, wherein the first value is different than the second value.

According to another aspect of the disclosure, a receiver includes a single PLL used for both L1 and L5 frequency bands; and a single VCO configured to output a frequency such that, when divided by 4, provides an LO frequency for the L5 frequency band, and when divided by 3, provides an LO frequency for the L1 frequency band.

BRIEF DESCRIPTION OF THE DRAWING

In the following section, the aspects of the subject matter disclosed herein will be described with reference to exemplary embodiments illustrated in the figures, in which.

DETAILED DESCRIPTION

Figure 1:
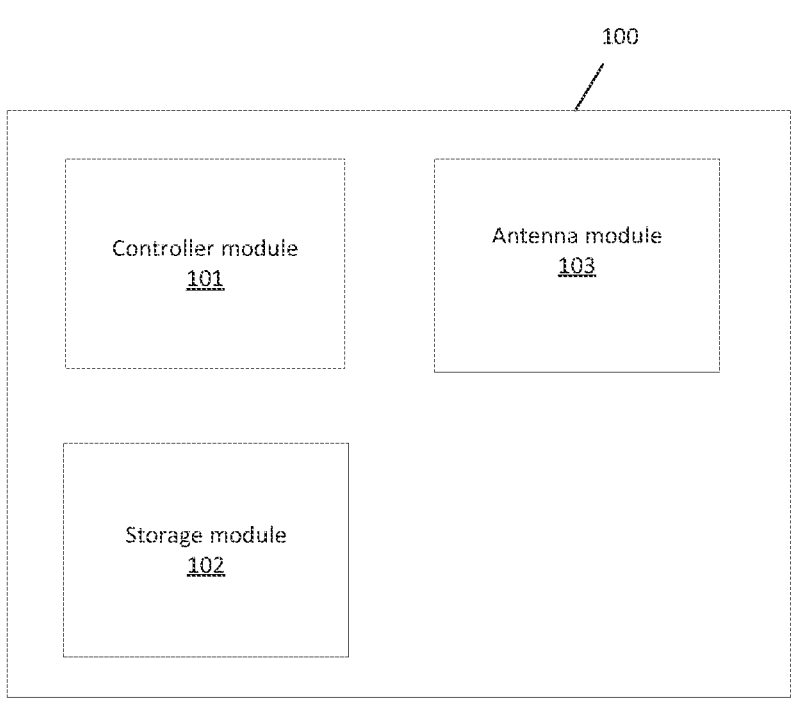
FIG. 1 is a block diagram illustrating an electronic device, according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/ or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

Throughout this description, the terms "unit," "module," and "component" are employed interchangeably, offering a flexible and versatile approach to describe the various aspects and elements of the disclosure. These terms are adaptable and their specific meanings can vary according to the contextual requirements of the description.

The terms "unit", "module", and/or "component" may be used to refer to an entity within the description, capable of performing one or more specific functions. A unit can encompass both tangible hardware elements, such as physical components or devices, and intangible software elements, like algorithms or routines. Units can function independently or collaboratively with other units to achieve the objectives of the invention.

The present disclosure pertains to a system designed to improve signal reception and accuracy in devices used in non-terrestrial systems, such as GNSS devices. The introduction of this system into modern GNSS devices results in enhanced performance by providing users with reliable and precise positional and temporal information.

One of the features of the present disclosure lies in its utilization of multiple frequency bands, such as both L1 and L5 bands, using a single PLL.

A PLL is an electronic circuit used to synchronize the phase and frequency of an output signal with that of a reference signal. This synchronization is achieved through a closed-loop control system. A single PLL typically includes one or more of a phase detector, a VCO, a low-pass filter, and integer or fractional-N frequency dividers.

The L1 band, historically one of the first operational navigation frequencies, has been widely adopted in various applications due to its proven reliability. Conversely, the L5 band is a more recent addition, and is a wider bandwidth than the L1 band, allowing better resolution in position solutions. This means signals in the L5 band can more effectively navigate through obstacles like dense foliage or urban structures.

The GPS L1 band has a center frequency of 1575.42 megahertz (MHz). The BeiDou, Galileo, GPS, and GLONASS systems occupy a bandwidth of approximately 15659 MHz to 1606 MHz. On the other hand, the GPS L5 band has a center frequency of 1176.45 and has a 20.46 MHz main-lobe. Other navigation systems also are located on the L5 band, including Galileo E5a, Galileo E5b, GLONASS G3, and BeiDou B2, all of which can be received and processed by an L5 receiver.

Using both the L1 and L5 bands enhances coverage and signal reliability. When combined, they cater to a broad spectrum of scenarios, ensuring a GNSS device maintains its signal even under unfavorable conditions. In addition, using both the L1 and L5 bands improves multipath modeling and ionosphere modeling since they occupy different areas in the frequency spectrum band.

An aspect of the present disclosure is the generation of multiple LO frequencies using a single VCO (e.g., or a circuit with a single PLL). Traditionally, multiple PLLs, each having their own oscillator, were required to generate different LO frequencies, leading to increased complexity, cost, and power consumption in GNSS designs. For instance, each additional PLL greatly increases power consumption because they each use their own oscillator. However, by reducing the number of oscillators used to produce multiple frequencies, power consumption and cost may be reduced, and the architecture is improved by reducing the area used on a chip for detecting L1 and L5 bands. This not only makes the GNSS devices more affordable but also extends their operational lifespan, making them a more sustainable choice for consumers.

FIG. 1 is a block diagram illustrating an electronic device, according to an embodiment.

Referring to FIG. 1, an electronic device 100 includes a controller module 101, a storage module 102 and a receiver module 103.

The electronic device 100 of FIG. 1 may include, or include instructions to, means for executing the functions corresponding to the hardware components discussed below. Additionally, embodiments of the present disclosure may be implemented as part of a larger computer and/or network system comprising a central processing unit (CPU), memory, and instructions.

The electronic device 100 may be a user equipment (UE) capable of wirelessly communicating with external electronic devices, such as satellites and base stations, providing utility in diverse applications like navigation, data transmission, or satellite-based communication. For example, the electronic device 100 may be a GNSS receiver device.

The controller module 101 may serve as the computational and operational hub, orchestrating the synchronized working of the electronic device's 100 components. The controller module 101 may be embodied by a processor, a microprocessor or a microcontroller. The controller module 101 may interpret instructions, process data from satellites, and direct actions based on the processed data. For instance, in the context of a smartphone, the controller module 101 could be an advanced chipset, enabling not just communication with satellites but also supporting other multifaceted functionalities of the device. Moreover, the controller module 101 may execute instructions for generating the accurate and programmable phase delay output signals, discussed above.

The storage module 102 provides a repository for data, both transient and persistent. The storage module 102 may include memory units, such as random access memory (RAM) for temporary data storage and read-only memory (ROM) or flash memory for permanent data storage. The storage module 102 may store instructions enabling the controller module 101 to execute the functions corresponding to the hardware components described below.

The receiver module 103 is a communication link between the electronic device 100 and external devices, such as orbiting satellites. The receiver module 103 may be an antenna and receive wireless signals from external devices. For example, the receiver module 103 may be a GNSS receiver.

Figure 2:
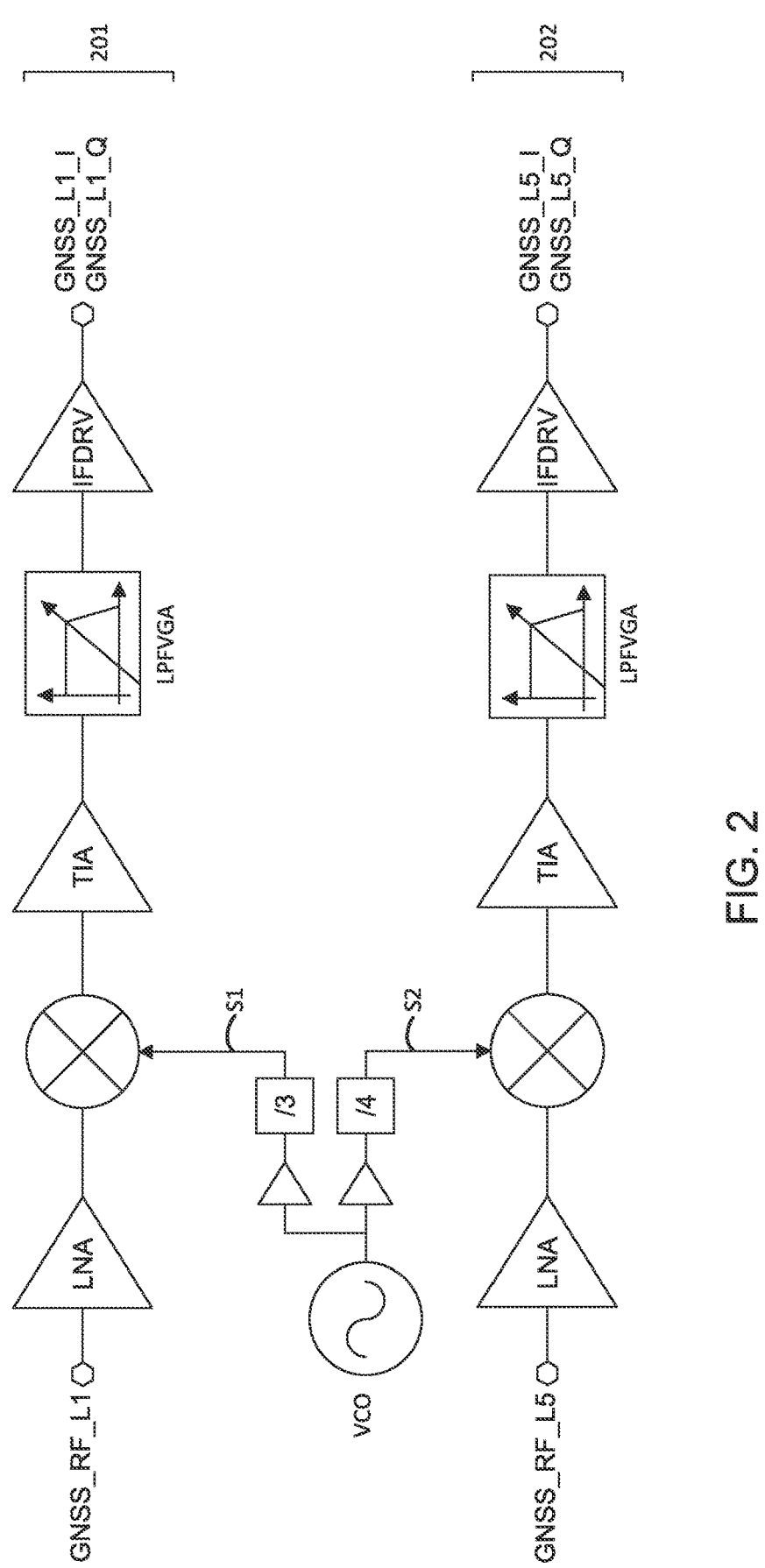
FIG. 2 is a schematic representation of a dual-band GNSS receiver circuitry architecture, according to an embodiment.

Although FIG. 2 illustrates a specific use pertaining to the L1 and L5 frequency bands, the schematic design illustrated in FIG. 2 may be employed in different frequency bands or spectrums.

Referring to FIG. 2, two separate frequency receiver paths are illustrated. A first receiver path 201 may be configured to receive L1 frequency bands, and a second path 202 may be configured to receive L5 frequency bands.

GNSS RF input terminals are illustrated: GNSS_RF_L1 for the receiver path 201 which may receive signals from the L1 frequency band, and GNSS_RF_L5 for the receiver path 202 which may receive signals from the L5 frequency band. Each of the input terminals are directly connected to a low noise amplifier (LNA) in their respective paths 201 and 202. The LNA may amplify the relatively weak incoming RF signals while introducing minimal additional noise.

Subsequent to the LNA in each path 201 and 202, a mixer component is presented. This mixer component receives the amplified signal from the LNA and combines (mixes) it with a specific LO frequency obtained from a frequency-divided signal S1 or S2.

In the receiver path 201, pertaining to the L1 band, the amplified GNSS_RF_L1 signal is mixed with a frequency-divided signal S1. In the receiver path 202, the amplified GNSS_RF_L5 signal is mixed with a frequency-divided signal S2. The frequency-divided signal S1 and the frequency-divided signal S2 are both generated from the same VCO. That is, as shown in FIG. 2, the signal generated from the VCO is split to two paths and fed into respective amplifiers. In the first path (corresponding to frequency-divided signal S1), the amplifier output is fed to a frequency divider component, denoted by "/3", which divides the frequency of the signal by 3. In the second path (corresponding to frequency-divided signal S2), the amplifier output is fed to a frequency divider component, denoted by "/4", which divides the frequency of the signal by 4.

The VCO may operate at a frequency selected so that when it is frequency-divided by 3, it produces the LO frequency necessary for the L1 path 201, and when it is frequency-divided by 4, it produces the LO frequency necessary for the L5 path 202. For example, the VCO may output a frequency of 4757.24 MHz. After amplification and division, the S1 signal frequency may be 1585.75 MHz, 1550 fx for mixing with the L1 path 201, and the S2 signal frequency may be 1189.31 MHz, 1162.5 fx for mixing with the L5 path 202.

S1 and S2 each include in-phase (I) and quadrature (Q) (I/Q) components. The I and Q components may be two sinusoids that are 90 degrees out of phase with each other. When these signals drive mixers, they allow the system to separately process both the amplitude and phase information of the incoming signal. This dual processing capability facilitates the demodulation of complex modulation schemes, where both amplitude and phase variations are able to carry meaningful data.

Following the mixer, the mixed signals are then directed to respective transimpedance amplifiers (TIAs) in the receiver path 201 and the receiver path 202. The TIAs convert current, produced by the mixing process, into a voltage signal, thereby facilitating further processing. Subsequent to the TIA, the signals fed into respective low pass filter (LPF) variable gain amplifiers (VGAs). The LPFVGAs have a designated filter order (e.g., 3 order) and cutoff frequency (e.g., 29 MHz) and may adjust each signal's amplitude (gain) within a designated margin for optimum linearity and noise performance.

From the LPFVGA's, the signals are passed to intermediate frequency differential receivers (IFDRVs) in the respective paths 201 and 202. The IFDRV components act as buffers to drive either on-chip or off-chip analog-to-digital converts (ADC), and are responsible for further amplifying the mixed signal and preparing it for digital conversion and processing, thereby producing output signals GNSS_L1_I and GNSS_L1_Q for the L1 path 201, and GNSS_L5_I and GNSS_L5_Q for the L5 path.

These represent the I and Q components of the processed signals for the L1 and L5 bands, respectively. The I and Q components provide a complete representation of GNSS signal phase and amplitude, enabling accurate positioning computations.

Thus, the circuitry architecture schematic shown in FIG. 2 is able to use only a single VCO for receiving signals in the L1 and L5 bands because it takes advantage of the fact that the L1 and L5 bands have roughly a 4:3 frequency ratio. That is, the center frequency of the L1 band is roughly 4/3 the center frequency of the L5 band. Accordingly, the value of the frequency generated by the VCO may be chosen so that when it is divided by 3, the L1 LO frequency is obtained, and when it is divided by 4, the L5 LO frequency is obtained. Therefore, the baseband paths (e.g., 201 and 202) are largely unchanged without requiring a significant new amount of power to receive signals in each frequency band.

In some cases, it may be difficult to obtain a quadrature output when the VCO is frequency-divided by 3 because this creates 120 degrees phase differences. However, a divide-by-3 circuit with 50% duty cycles may be used to generate 90 degree phase differences by adding delay to one of the outputs.

Figure 3:
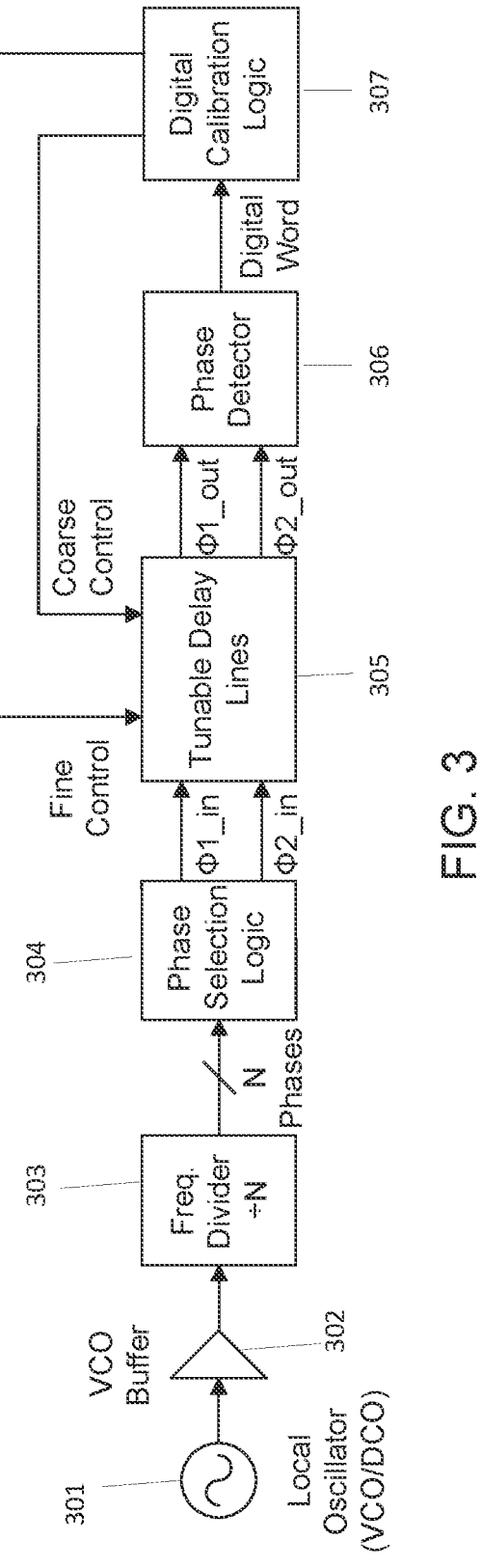
FIG. 3 is a block diagram illustrating a system for generating phase delays, according to an embodiment.

FIG. 3 is a block diagram illustrating a system for generating phase delays, according to an embodiment. The diagram illustrated in FIG. 3 may be implemented by digital circuits which may include a finite state machine and logic gates. In addition, the functions of each component of FIG. 3 may be implemented by a processor based on instructions stored in a storage device.

Referring to FIG. 3, the LO 301 can include various types of oscillators, such as a VCO or a digitally-controlled oscillator (DCO) (e.g., a low noise ring oscillator). The LO 301 generates a periodic waveform, such as a sine wave or square wave, whose frequency can be adjusted by an external voltage or digital signal. The LO transmits a signal to the VCO buffer 302.

The VCO buffer 302 safeguards the signal's integrity by isolating the signal from the subsequent stages in the system, ensuring a stable output signal feeds the frequency divider 303 and protects the oscillator from any potential loading effects.

The frequency divider 303 takes this buffered oscillator signal from the VCO buffer 302 and divides its frequency by a specific factor, denoted as "N". As a result, it produces N distinct clock phases, each having a phase difference of 360/N degrees. For instance, if the factor N is 3, the output will consist of three phases, each separated by 120 degrees.

Two consecutive phases from the output of the frequency divider 303 (separated by 360/N degrees) are fed into the phase selection logic 304. The phase selection logic component 304 estimates which of the identified two consecutive phases are leading or lagging. This estimation ensures that the lag phase is fed along the Φ1_in path, and the lead phase is fed along the Φ2_in path to the tunable delay lines 305.

The selected phases (Φ1_in and Φ2_in) are then introduced as delay lines into the tunable delay lines 305. These delay lines can add variable delay to the incoming signals, enabling fine-tuning of their phase. They can be adjusted or "tuned" using a coarse control signal and/or a fine control signal. With multiple taps available, a broad spectrum of delay values can be achieved, enabling precise control over the phase.

From here, the phase detector 306 measures the phase difference between two outputs of the tunable delay lines 305. By comparing these outputs, the phase detector 106 determines how closely they align with the desired phase difference.

This phase difference is then converted into a digital word, encapsulating the magnitude and direction of the phase error. This digital word is processed by the digital calibration logic 307. Based on the data from the phase detector 306, the digital calibration logic 307 determines the necessary adjustments to the tunable delay lines 305. The digital calibration logic 307 transmits two signals: the coarse control signal and the fine control signal. The coarse control makes larger, more significant adjustments to the delay, while the fine control allows for detailed, precise modifications.

This dynamic feedback loop can always be on so that errors are dynamically reduced. Alternatively, the dynamic feedback loop can operate on demand, such as during power-up or when a significant temperature change has occurred. Accordingly, a dynamic and adaptive mechanism is provided to generate clock signals with highly precise, programmable phase differences by leveraging the capabilities of frequency dividers combined with particularly tuned delay lines.

Accordingly, a quadrature output that has a 90 degree phase difference may be obtained by implementing a circuit with the components shown in FIG. 3. Thus, a multiple-frequency receiver that uses only a single VCO can be achieved.

Figure 4:
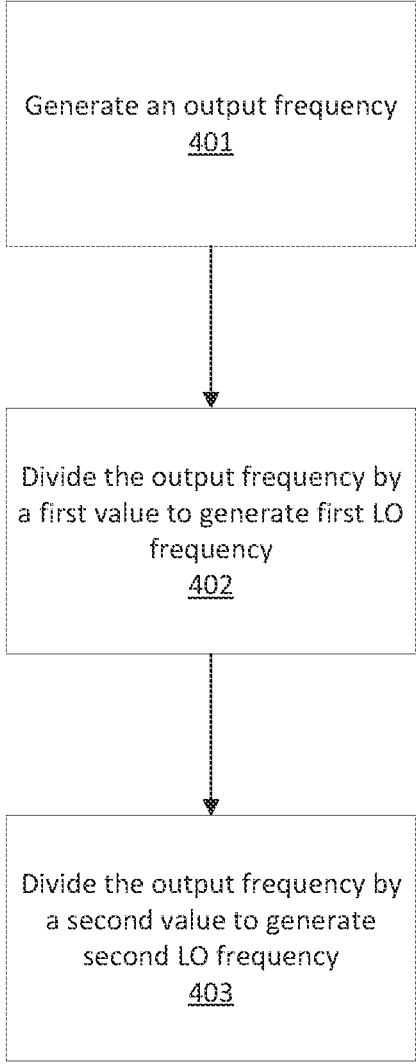
FIG. 4 is a flowchart illustrating a method for generating first and second LO frequencies, according to an embodiment.

FIG. 4 is a flowchart illustrating a method for generating first and second LO frequencies, according to an embodiment. The steps illustrated in FIG. 4 may be performed be implemented by a circuit designed off of the architecture shown in FIG. 2. Additionally, some or all of the steps may be executed by processor based on instructions stored in a memory.

Referring to FIG. 4, in step 401, an output frequency is generated. The output frequency may be generated based on a VCO, either directly or indirectly. In step 402, the output frequency is divided by a first value to generate a first LO frequency. The first LO frequency may be generated to fall within the frequency range for receiving signals on the L1 frequency chain. In step 403, the output frequency is divided by a second value to generate a second LO frequency. The second LO frequency may be generated to fall within the frequency range for receiving signals on the L5 frequency chain.

Embodiments of the subject matter and the operations described in this specification may be implemented in digital electronic circuitry, or in computer software, firmware, or hardware, including the structures disclosed may be implemented as one or more computer programs, i.e., one or more modules of computer-program instructions, encoded on computer-storage medium for execution by, or to control the operation of data-processing apparatus. Additionally or alternatively, the program instructions can be encoded on an artificially-generated propagated signal, e.g., a machine-generated electrical, optical, or electromagnetic signal, which is generated to encode information for transmission to suitable receiver apparatus for execution by a data-processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple compact disks (CDs), disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A multiple-frequency receiver comprising:
a single voltage-controlled oscillator (VCO) configured to generate an output frequency;
a first division circuit configured to divide the output frequency by a first value to generate a first local oscillator (LO) frequency for a first frequency chain; and
a second division circuit configured to divide the output frequency by a second value to generate a second LO frequency for a second frequency chain,
wherein the first value is different than the second value, and
wherein the first division circuit comprises:
a first frequency divider configured to divide the output frequency of the VCO by three and to output a first divided output signal, a second divided output signal, and a third divided output signal; and
a phase selection logic configured to select two signals having consecutive phases of the first divided output signal, second divided output signal, and third divided output signal, and to output a first phase signal and a second phase signal.

2. The multiple-frequency receiver of claim 1, further comprising a down-converter configured to down-convert in-phase and quadrature signals received from the first frequency chain and the second frequency chain using the first LO frequency and the second LO frequency, respectively.

3. The multiple-frequency receiver of claim 2, further comprising a front-end-processing (FEP) unit configured to amplify, filter, and convert the down-converted signals to a digital form.

4. The multiple-frequency receiver of claim 3, wherein the FEP unit is configured to shift frequencies of the down-converted signals.

5. The multiple-frequency receiver of claim 1, wherein the first division circuit and the second division circuit are both configured to generate in-phase and quadrature signals separated by 90-degree.

6. The multiple-frequency receiver of claim 1, wherein the output frequency of the VCO is selected such that a frequency equivalent to $\frac{1}{3}$ of the output frequency is used to generate the first LO frequency for a global navigation satellite system (GNSS) L1 receiver, and a frequency equivalent to $\frac{1}{4}$ of the output frequency is used to generate the second LO frequency for a GNSS L5 receiver.

7. The multiple-frequency receiver of claim 1, wherein the first frequency chain is an L1 frequency chain and the second frequency chain is an L5 frequency chain.

8. The multiple-frequency receiver of claim 1, wherein the second value is 4.

9. A method comprising:
generating an output frequency using a single voltage-controlled oscillator (VCO);
dividing the output frequency by a first value to generate a first local oscillator (LO) frequency for a first frequency chain; and
dividing the output frequency by a second value to generate a second LO frequency for a second frequency chain,
wherein the first value is different than the second value, and
wherein dividing the output frequency by the first value comprises:
dividing the output frequency of the VCO by three and outputting a first divided output signal, a second divided output signal, and a third divided output signal; and selecting two signals having consecutive phases of the first divided output signal, second divided output signal, and third divided output signal, and outputting a first phase signal and a second phase signal.

10. The method of claim 9, further comprising down-converting in-phase and quadrature signals received from the first frequency chain and the second frequency chain using the first LO frequency and the second LO frequency, respectively.

11. The method of claim 10, further comprising amplifying, filtering, and converting the down-converted signals to a digital form.

12. The method of claim 11, further comprising shifting frequencies of the down-converted signals.

13. The method of claim 9, wherein the first LO frequency and the second LO frequency both include 90-degree in-phase and quadrature signals.

14. The method of claim 9, wherein the output frequency of the VCO is selected such that a frequency equivalent to $\frac{1}{3}$ of the output frequency is used to generate the first LO frequency for a global navigation satellite system (GNSS) L1 receiver, and a frequency equivalent to $\frac{1}{4}$ of the output frequency is used to generate the second LO frequency for a GNSS L5 receiver.

15. The method of claim 9, wherein the first frequency chain is an L1 frequency chain and the second frequency chain is an L5 frequency chain.

16. The method of claim 9, wherein the second value is 4.

17. A receiver, comprising:
a single phase-locked loop (PLL) used for both L1 and L5 frequency bands;
a single voltage-controlled oscillator (VCO) configured to output a frequency such that, when divided by 3, provides a local oscillator (LO) frequency for the L1 frequency band, and when divided by 4, provides an LO frequency for the L5 frequency band; and
a phase selection logic configured to select two signals of a first divided output signal, a second divided output signal, and a third divided output signal having consecutive phases output from a frequency divider, and to output a first phase signal and a second phase signal.

18. The receiver of claim 17, further comprising a down-converter configured to down-convert in-phase and quadrature signals received from the L1 frequency band and the L5 frequency band using the LO frequency for the L5 frequency band and the LO frequency for the L1 frequency band, respectively.

19. The receiver of claim 18, further comprising a front-end-processing (FEP) unit configured to amplify, filter, and convert the down-converted signals to a digital form.

20. The receiver of claim 19, wherein the FEP unit is configured to shift frequencies of the down-converted signals.

\* \* \* \* \*